T868008

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specification, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED NOVEMBER 18, 1969

868 O.G. 731

825,262
LITHOGRAPHIC PRINTING PLATE
Edward C. Yackel, Pittsford, N.Y.
(% Eastman Kodak Company, Rochester, N.Y. 14650)
Filed May 16, 1969. Published Nov. 18, 1969
Int. Cl. G03f *7/02;* B41m *5/00;* B41n *3/00*
U.S. Cl. 96—33
1 Sheet Drawing. 9 Pages Specification

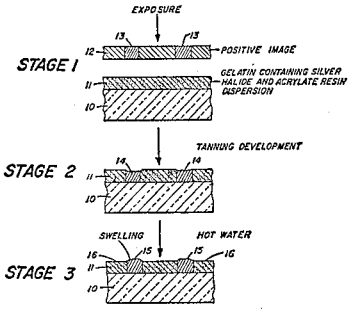

The instant invention relates to a method of making a direct positive lithographic printing plate which comprises coating a support with a layer of hydrophilic colloid containing silver halide and an aqueous colloidal dispersion of a water-insoluble soft vinyl resin, exposing the sensitive colloid layer to light under an image, developing the exposed layer under conditions of tanning development, and treating the developed layer with hot water to swell the colloid in the exposed regions of the layer and to remove hydrophilic colloid from thhe unexposed regions without removing the resin.

T868008
825262
Nov. 18, 1969 E. C. YACKEL DEF. PUB.
LITHOGRAPHIC PRINTING PLATE
Filed May 16, 1969
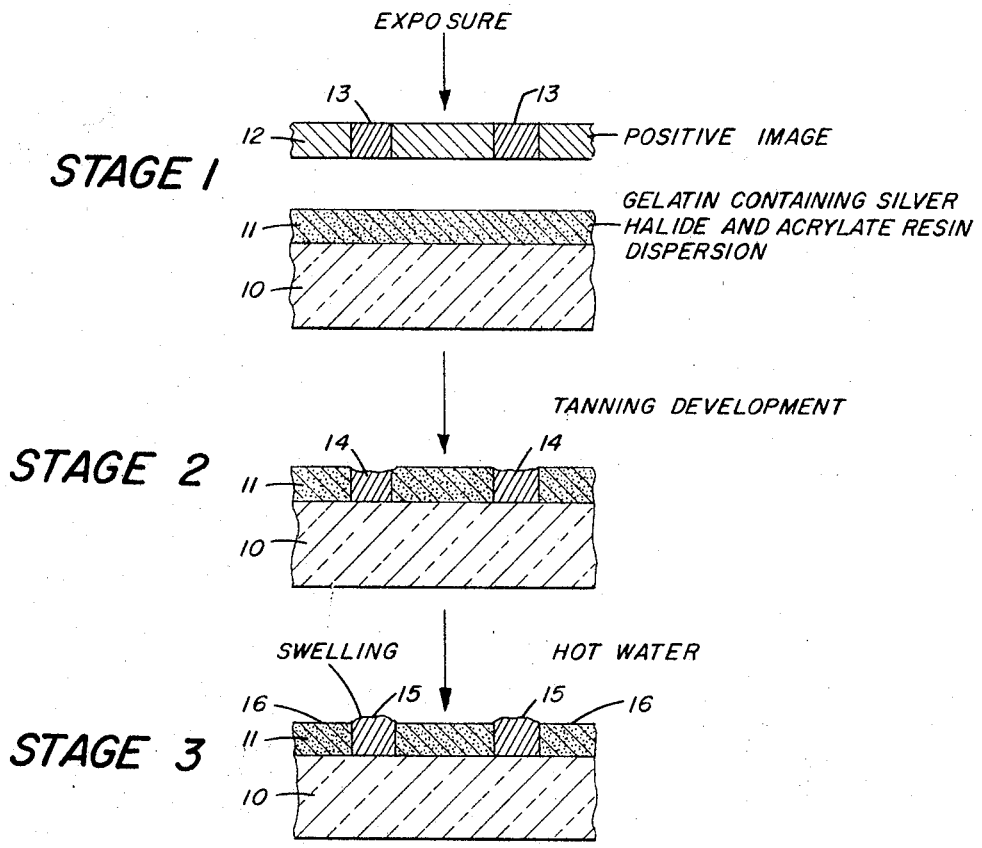
EDWARD C. YACKEL
INVENTOR.
BY Henry S. Sperry
ATTORNEY